Dec. 10, 1963 D. Q. FULLER 3,114,086

TRANSISTOR WAFER AND ENCLOSURE FOR THE ELECTRODES

Filed Aug. 1, 1958

Inventor
D.Q. FULLER
By
Holcomb, Wetherill & Brisebois
Attorneys

United States Patent Office 3,114,086

Patented Dec. 10, 1963

3,114,086

TRANSISTOR WAFER AND ENCLOSURE FOR THE ELECTRODES

Dennis Q. Fuller, Cambridge, England, assignor to Pye Limited, Cambridge, England, a British company Filed Aug. 1, 1958, Ser. No. 752,449
Claims priority, application Great Britain Aug. 8, 1957
1 Claim. (Cl. 317—234)

The present invention relates to the construction and assembly of semiconductor devices, such as semiconductor rectifiers and transistors.

According to the present invention, a semiconductor device comprises a disc or wafer of semiconductor material forming one electrode of the device in which at least one surface of the disc or wafer is covered by a hollow metal cap conductively attached by its rim to the periphery of said surface, said cap, or each cap, having an insulating member at its crown providing an insulating lead-through for a conductor connected to another electrode of the device. The semiconductor material may be, for example, germanium or silicon.

As applied to a semiconductor rectifier device, one surface of the disc or wafer is provided with a metal cap which covers an electrode on that surface and the other surface may be conductively connected to a metal member such as a stud or plate forming a heat sink.

As applied to a three-electrode device such as a transistor having an electrode formed on each side of the disc or wafer, a metal cap would be provided on both of the opposite surfaces of the disc or wafer.

The invention also consists in a transistor comprising a disc or wafer of semiconductor material, preferably circular in shape, forming the base region which has a conductive area around the periphery of each of its opposite surfaces and has hollow metal caps attached by their rims to the conductive area on each face, each cap having an insulating member at its crown providing an insulating lead-through for conductors connected respectively to the emitter and collector regions which are enclosed within the caps.

Figure 1:
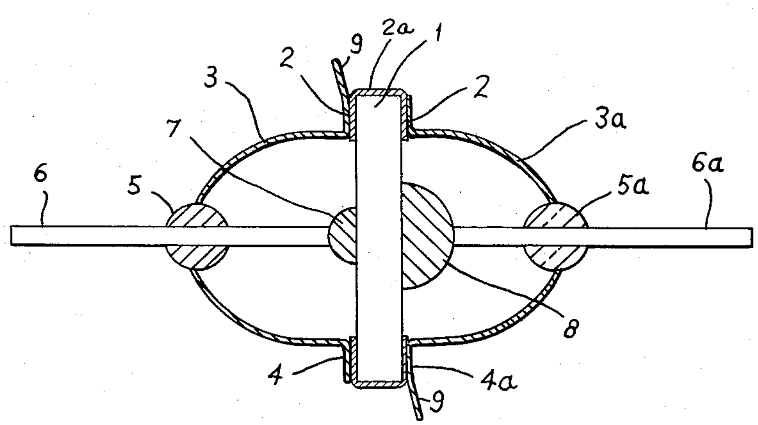
Figure 2:
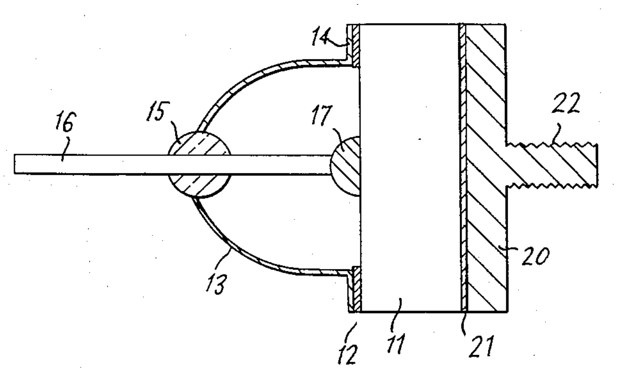

In order that the invention may be more fully understood, reference will now be made to the accompanying drawing, in which:

FIGURE 1 is a section through a transistor constructed according to the invention, and FIGURE 2 is a section through a diode device constructed according to the invention.

Referring to FIGURE 1, a circular disc or wafer of germanium 1 is plated or tinned around the periphery of each face, as shown at 2, to provide an ohmic connection thereon. The tinned area also extends from face to face across the edge of wafer, as shown at 2*a*. 3 and 3*a* are domed metal caps having their rim portions 4, 4*a*, which may be outwardly flanged, attached respectively to the conductive area 2 of each face, for example by soldering. Each cap has an insulating bead 5, 5*a* of glass or other insulating material sealed in an aperture in its crown, through which extend conductors 6, 6*a* connected respectively to the emitter and collector regions 7 and 8, which are enclosed within the caps.

The base connection can be made by means of a tag 9 projecting from the caps or by clamping a connecting ring or tag therearound. Alternatively a heat sink can be clamped about the transistor assembly; the external heat sink can be made in many ways and will be in closest possible proximity to the wafer.

FIGURE 2 shows a diode device comprising a circular wafer of germanium or silicon 11, provided with a metallic coating 12 around the periphery of one face, carrying an electrode 17, and which forms an ohmic connection on that face. A domed metal cap 13 is positioned over the electrode 17 with its outwardly flanged rim 14 attached to the conductive area 12, e.g. by soldering. The conductor 16 to the electrode 17 extends through an insulating bead 15 in the crown of the cap. The other surface of the wafer is secured to a metal base member 20, for example by soldering the base member to a metallic coating 21 on that surface of the wafer to form an ohmic connection thereto. The base member 20 forms a heat sink and may be provided with a threaded stud 22 to secure it to a chassis or other support.

The construction described enables semiconductor devices of very small size to be constructed whilst retaining mechanical strength and avoiding atmospheric contamination. It will be seen that the overall size of the devices in the plane of the disc or wafer, or in parallel planes, is not larger than the dimensions of the disc or wafer itself. In the case of transistors, the emitter and collector regions are hermetically sealed within the caps and production requirements are simplified since the two metal caps may be identical and simple in construction. The arrangement also avoids the necessity of a special base arrangement, the metallised wafer itself being exposed for connection. By providing a base connection on each side of the wafer the base resistance is reduced.

I claim:

A transistor comprising a wafer of semiconductor material forming the base region, a conductive area around the periphery of each of the opposite surfaces of said wafer, and extending from face to face across the edge of the wafer, two domed metal caps each having an outwardly flanged rim substantially co-extensive with the periphery of the wafer and which are respectively directly conductively attached by their rims to the conductive areas on the opposite surfaces of the wafer, each cap having an insulating member at its crown providing an insulating lead-through for conductors connected respectively to the emitter and collector regions which are respectively formed on said opposite surfaces, whereby said emitter and collector regions are hermetically enclosed within the caps but the edge of the wafer remains exposed.

References Cited in the file of this patent

UNITED STATES PATENTS

| | | |
|---|---|---|
| 2,794,942 | Cooper | June 4, 1957 |
| 2,817,048 | Thuermel et al. | Dec. 17, 1957 |
| 2,854,610 | Waters et al. | Sept. 30, 1958 |
| 2,855,334 | Lehovec | Oct. 7, 1958 |
| 2,864,980 | Mueller et al. | Dec. 16, 1958 |
| 2,876,401 | Fuller | Mar. 3, 1959 |
| 2,882,464 | Blais | Apr. 14, 1959 |
| 2,893,904 | Dickson | July 7, 1959 |
| 2,939,204 | Knott et al. | June 7, 1960 |